US012811577B2

(12) United States Patent
Chandran J et al.

(10) Patent No.: US 12,811,577 B2
(45) Date of Patent: Nov. 24, 2026

(54) SWITCH CONTROL SYSTEM

(71) Applicant: Analog Devices International Unlimited Company, Limerick (IE)

(72) Inventors: Ashok Chandran J, Bangalore (IN); William Michael James Holland, Edinburgh (GB); Ranganathan Ramaswamy, Bangalore (IN); Brian Rush, Southlake, TX (US)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 19/087,018

(22) Filed: Mar. 21, 2025

(65) Prior Publication Data

US 2026/0291484 A1 Sep. 24, 2026

(51) Int. Cl.
*H03K 17/082* (2006.01)

(52) U.S. Cl.
CPC .................................. *H03K 17/082* (2013.01)

(58) Field of Classification Search
CPC .................................................... H03K 17/082
See application file for complete search history.

(56) References Cited

U.S. PATENT DOCUMENTS

2007/0139970 A1 6/2007 Mese et al.
2015/0023080 A1 1/2015 Chambon
2023/0216395 A1 7/2023 Durst et al.
2024/0372476 A1 * 11/2024 Kumar .................. H02M 1/007

FOREIGN PATENT DOCUMENTS

CN 122801749 A 9/2026
EP 2562893 A2 * 2/2013 ........... H03K 17/167
WO WO-2022073111 A1 * 4/2022 .......... H02M 7/4837
WO WO-2023092224 A1 * 6/2023 .............. H02P 27/14

OTHER PUBLICATIONS

"Arm® Cortex®-M7 32-bit 550 MHz MCU, up to 1 MB Flash, 564 KB RAM, Ethernet, USB, 3x FD-CAN, Graphics, 2x 16-bit ADCs", STMicroelectronics, (2021), 284 pgs.

(Continued)

*Primary Examiner* — Adam D Houston
(74) *Attorney, Agent, or Firm* — Schwegman Lundberg & Woessner, P.A.

(57) ABSTRACT

A switch control system for controlling a switch group, including two or more switches, to generate a switched output signal, including more than two discrete voltage levels, can include a sequencer, which can be configured to control respective on states and off states of one or more of the two or more switches to generate the switched output signal. This can include controlling the two or more switches through a specified sequence of switch states, where each switch state can include a respective state of one or more of the two or more switches. The switch states can include two or more power states, which can be configured for generating a portion of the switched output signal. The switch states can include one or more transition states, which can be configured for preventing at least one of shoot-through, a reverse current condition, or damage to the switch group when switching between power states.

20 Claims, 9 Drawing Sheets

(56) References Cited

OTHER PUBLICATIONS

"i.MX RT1020 Crossover Processors for Consumer Products", NXP Semiconductors, (2021), 102 pgs.
"TMS320 Second Generation Digital Signal Processors", Texas Instruments, (Nov. 1990), 71 pgs.
"TMS320F28P65x Real-Time Microcontrollers", Texas Instruments, (Nov. 2023), 355 pgs.
"European Application Serial No. 26161770.8, Extended European Search Report mailed Sep. 11, 2026", 7 pgs.
Pols Van, Der E. K. H., et al., "Design and Implementation of a Pulse Width Modulator For a Three-Level Inverter Using a Microprocessor and Eplds", Control in Power Electronics. Brighton, (Sep. 13, 1993), 6 pgs.

* cited by examiner

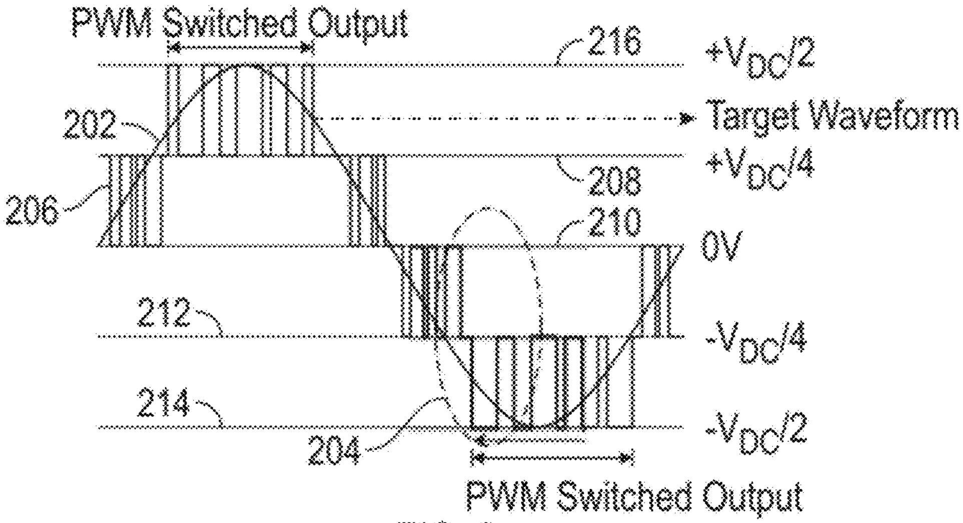
FIG. 2
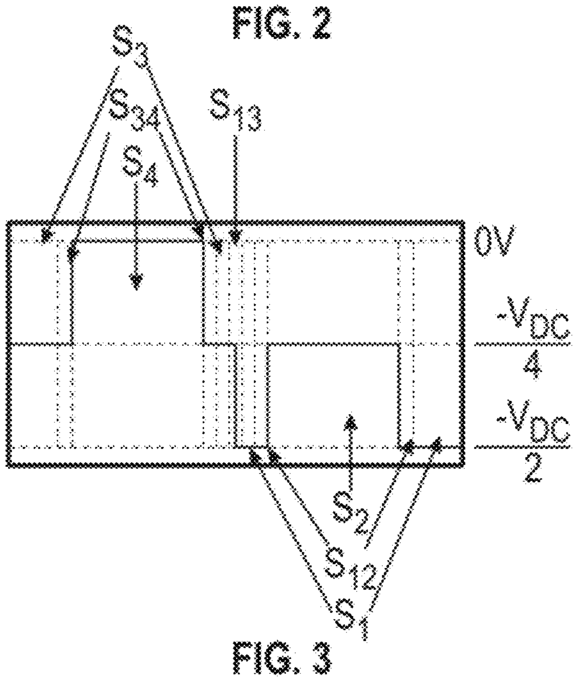
FIG. 3
| | Switch Logic Level | | | | | | | | |
|---|---|---|---|---|---|---|---|---|---|
| State | $T_1$ | $T_2$ | $T_3$ | $T_4$ | $T'_1$ | $T'_2$ | $T'_3$ | $T'_4$ | $V_{out}$ |
| $S_1$ | 0 | 0 | 0 | 0 | 1 | 1 | 1 | 1 | $-V_{DC}/2$ |
| $S_{12}$ | 0 | 0 | 0 | 0 | 1 | 1 | 1 | 0 | |
| $S_2$ | 0 | 0 | 0 | 1 | 1 | 1 | 1 | 0 | $-V_{DC}/4$ |
| $S_{13}$ | 0 | 0 | 0 | 0 | 1 | 1 | 0 | 1 | |
| $S_3$ | 0 | 0 | 1 | 0 | 1 | 1 | 0 | 1 | $-V_{DC}/4$ |
| $S_{34}$ | 0 | 0 | 1 | 0 | 1 | 1 | 0 | 0 | |
| $S_4$ | 0 | 0 | 1 | 1 | 1 | 1 | 0 | 0 | -0V |
| ... | ... | ... | ... | ... | ... | ... | ... | ... | |
FIG. 4

SWITCH CONTROL SYSTEM

TECHNICAL FIELD

The present disclosure relates to the control of switches, and more particularly, but not by way of limitation, to a system for controlling switches using software defined patterns.

BACKGROUND

Switched output systems can use switches to generate a switched output signal from an input source. The switched output signal can be used to power or control electrical loads, devices, or equipment. The switched output signal can be used for power conversion (e.g., AC-to-DC conversion, DC-to-AC conversion, AC-to-AC conversion, DC-to-DC conversion etc.). The switched output system can be configured to avoid entering "illegal" states, in which current may flow in an undesirable way.

SUMMARY

In an example, a switch control system for controlling a switch group, including two or more switches, to generate a switched output signal, including more than two discrete voltage levels, can include a sequencer, which can be configured to control respective on states and off states of one or more of the two or more switches to generate the switched output signal. This can include controlling the two or more switches through a specified sequence of switch states, where each switch state can include a respective state of one or more of the two or more switches. The switch states can include two or more power states, which can be configured for generating a portion of the switched output signal. The switch states can include one or more transition states, which can be configured for preventing at least one of shoot-through, a reverse current condition, or damage to the switch group when switching between power states.

In an example, a method for generating a switched output signal including more than two discrete voltage levels can include controlling two or more switches in a switch group using a sequencer. This can include controlling respective on and off states of the two or more switches to generate the switched output signal. The method can also include controlling the two or more switches to proceed through a specified sequence of switch states, where each switch state can include a respective state for each of the at least two switches. The method can also include controlling the switch group to enter switch states including two or more power states, which can be configured for generating a portion of the switched output signal, and one or more transition states, which can be configured for preventing one or more of shoot-through, reverse current, or damage to the switch group when switching between power states.

In an example, a switch control system for controlling a switch group, including six or more switches, to generate a switched output signal, including five or more discrete voltage levels, can include a sequencer, which can be configured to control respective on states and off states of the six or more switches, such as to generate the switched output signal. This can include to control the six or more switches through a specified sequence of switch states, where each switch state includes a respective state for one or more of the six or more switches. The switch control system can also include a sequencer, which can be configured to control respective on states and off states of the six or more switches to generate the switched output signal. The switch control system can also include a controller, which can be configured to send configuration information to the sequencer. The sequencer can be configured to control the respective on states and off states of the six or more switches using PWM signals based on the received configuration information where the switch states include two or more power states, which can be configured for generating a portion of the switched output signal, and one or more transition states, which can be configured for preventing at least one of shoot-through, a reverse current condition, or damage to the switch group when switching between power states.

BRIEF DESCRIPTION OF THE DRAWINGS

In the drawings, which may not be drawn to scale, like numerals may describe substantially similar components throughout one or more of the views. Like numerals having different letter suffixes may represent different instances of substantially similar components. The drawings illustrate generally, by way of example but not by way of limitation.

FIG. 2 shows an example of portions of a switched output signal.

FIG. 3 shows an example of portions of the switched output signal of FIG. 2.

FIG. 4 shows an example of portions of a state table.

DETAILED DESCRIPTION

In an approach, dedicated hardware circuitry can be used to check for and/or prevent illegal states. This hardware circuitry can be one or more of expensive, have a large power or area consumption, or limited in function. For this reason, it can be desirable to use a switch control system that is at least partially software based.

The present inventors have recognized, among other things, that a software based switch control system can be configured to check for illegal states and/or utilize transition states to avoid entering an illegal state. This can be beneficial in a multi-level (e.g., more than 2 levels) switched output system, such as can be used in a power inverter. Multi-level switched output systems can include multiple switches, which can increase the number of illegal states, the difficulty of anticipating, detecting, and/or avoiding illegal states, or both.

Furthermore, the present inventors have recognized, among other things, that it can be desirable to program a switch control system to have defined patterns of switch states, which can be used to form a specified part of a switched output signal. Using a pattern can create a level of abstraction that can simplify the programing of the switch control system, the structure and/or operation of the switch control system, or both.

Figure 1A:
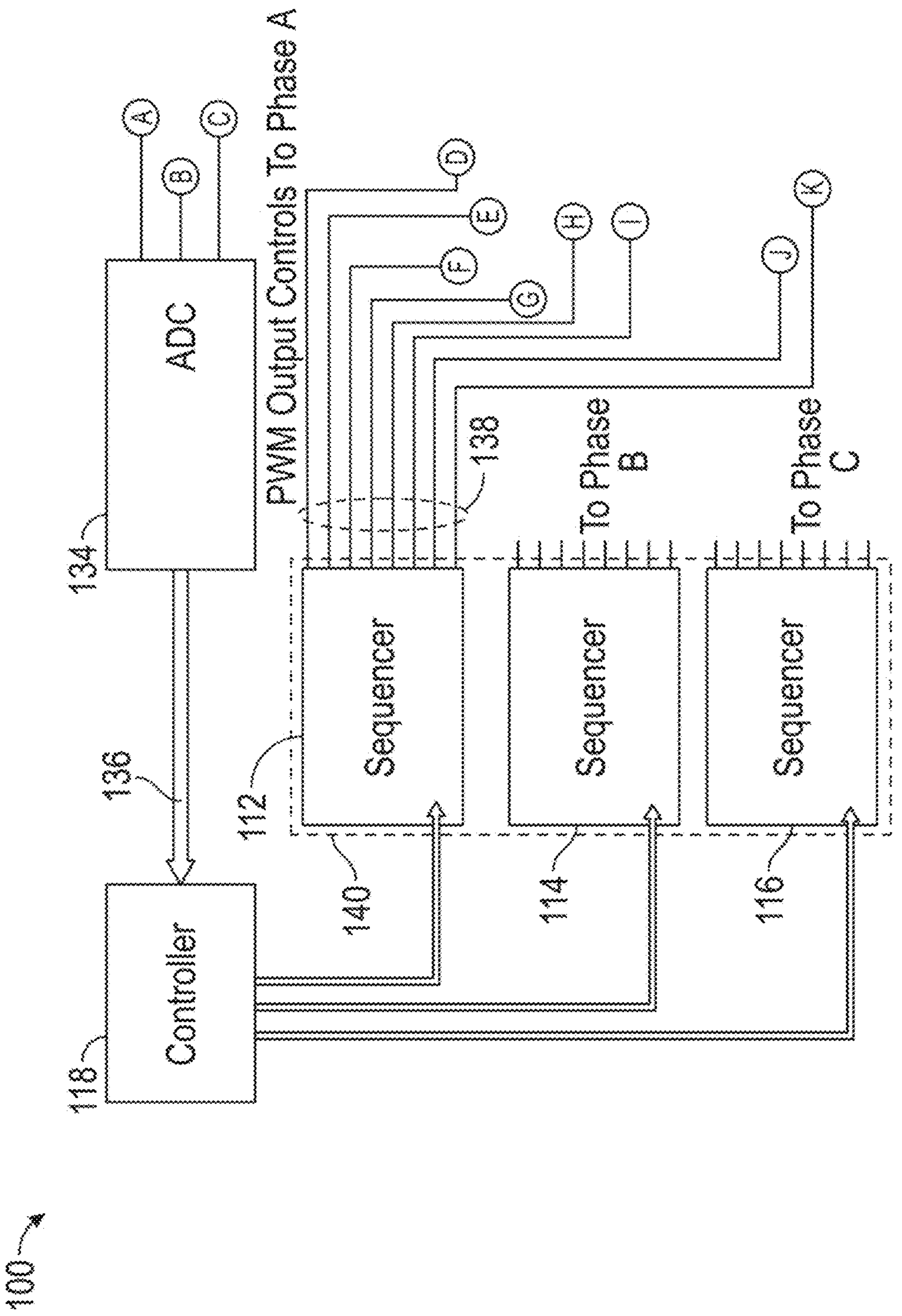
FIG. 1A shows an example of portions of a switch control system.
Figure 1B:
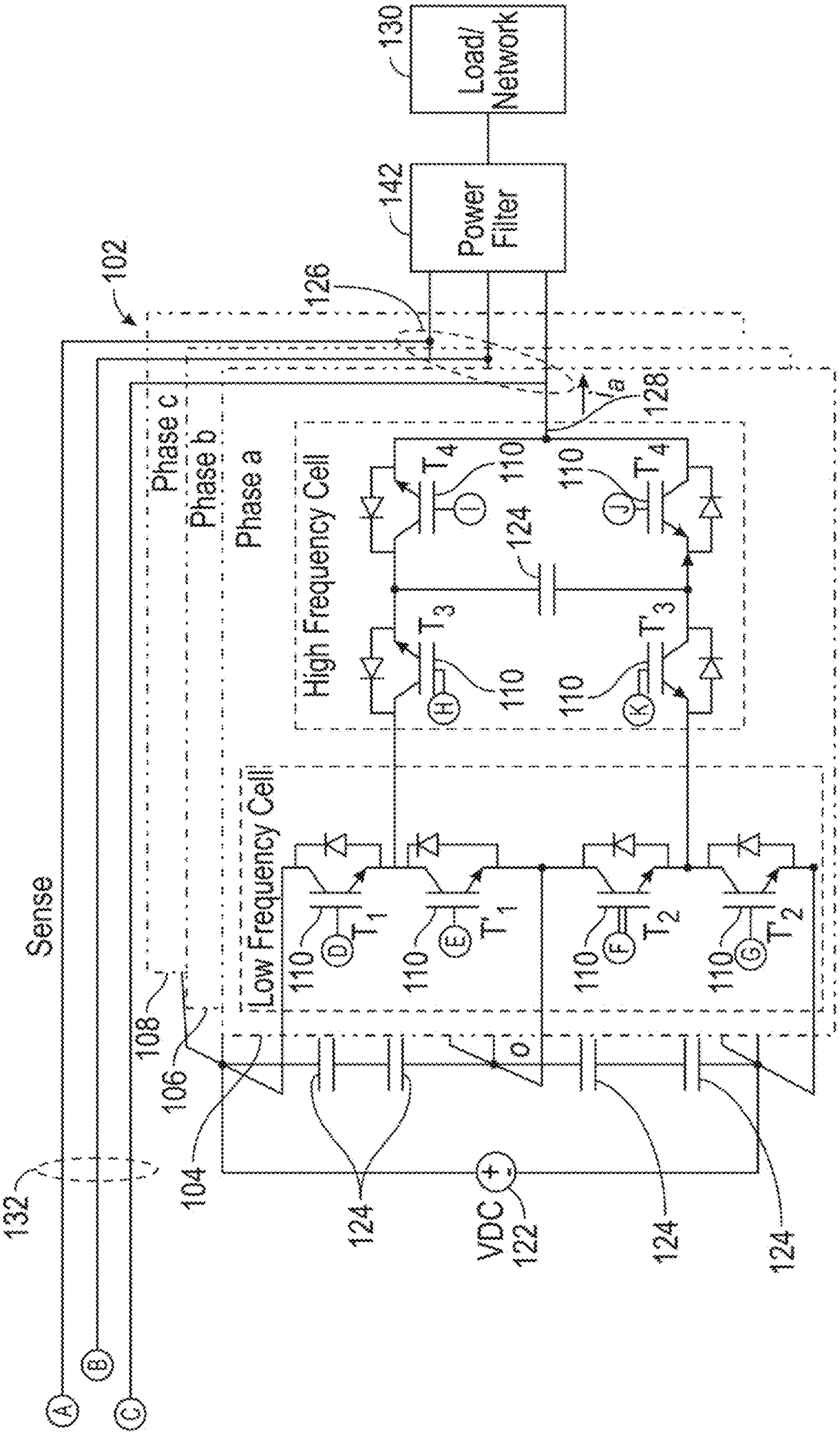
FIG. 1B shows an example of portions of a switch control system including a switch group.

FIG. 1A and FIG. 1B show an example of portions of a switch control system 100. FIG. 1A and FIG. 1B show that the switch control system 100 can include a controller 118 and a sequencer 140. FIG. 1A and FIG. 1B show that the switch control system 100 can include or be coupled to a switch group 102. The switch group 102 can generate one or more switched output signals at corresponding switched output signal nodes 126, such as which can be used to power a load 130.

The switch group 102 can include any number of switches 110, which can include one switch, two switches, three switches, four or more switches, 6 or more switches, 8 or more switches, or 24 or more switches. The switches 110 can be arranged in any configuration. The switch group 102 can also include additional components and/or circuitry, such as can include one or more capacitors 124. The switch group 102 can be included in any system. The switch group 102 can be configured for any function and/or purpose. In an example, a portion or all of the switch group 102 can be included in the switch control system 100. In an example, a portion or all of the switch group 102 can be separate from the switch control system 100.

In an example (e.g., as shown in FIG. 1A and FIG. 1B), the switch group 102 can be used in a power inverter, which can generate a specified switched output signal at corresponding switched output signal nodes 126 using power received from an input source 122. For example, the switch group 102 can be used to generate an alternating current (AC) switched output signal at the switched output signal nodes 126 having a specified frequency and/or amplitude. The switched output signal on the switched output signal node 126 may be passed through a filter, such as the filter 142, prior to reaching the load 130. The input source 122 can be any power source, which can include a direct current (DC) source (e.g., as in the example of FIG. 1B) or an AC source having any voltage. In an example, the input source 122 can be a DC power source that is generated by rectifying an AC source (e.g., line power). The switch group 102 can be, include, or be included in an inverter, such as a power inverter and/or a variable frequency drive.

FIG. 1A and FIG. 1B show that the switch group 102 can include more than one phase, such as which can include three phases. This can help to allow the switch group 102 to generate a three-phase power signal. The switch group 102 can include a first phase switch group 104, a second phase switch group 106, and a third phase switch group 108. The second phase switch group 106 and the third phase switch group 108 can be configured similarly to the first phase switch group 104, or can differ in one or more ways.

The first phase switch group 104 can be configured to generate a first phase switched output signal 206 (e.g., as discussed below with respect to FIG. 2) at a first phase switched output signal node 128 having any number of discrete (e.g., quantized, digital) voltage levels, which can include two discrete voltage levels, three discrete voltage levels, four discrete voltage levels, or five or more discrete voltage levels. For example, the first phase switch group 104 can be a five-level inverter, such as can have output values of: ½ VDC, 14 VDC, 0, −¼ VDC, and −½ VDC.

The sequencer 140 can be configured to control respective on states and off states of one or more of the switches 110, such as to generate the switched output signal at the corresponding switched output signal nodes 126. For example, one or more of the switches 110 can be binary switches (e.g., digital switches), which can include an "on" state (e.g., electrically coupling or substantially electrically coupling the switch nodes together) and an "off" state (e.g., electrically decoupling or substantially electrically decoupling the switch nodes). In an example, the switches 110 can be configured to operate as binary switches (e.g., transistors biased and/or controlled to operate as substantially binary switches). In an example, the sequencer 140 can include a first phase sequencer 112, a second phase sequencer 114, and a third phase sequencer 116. The first phase sequencer 112 can be configured to control respective "on" states and "off" states of one or more of the switches 110 in the first phase switch group 104. The second phase sequencer 114 can be configured to control respective "on" states and "off" states of one or more of the switches 110 in the second phase switch group 106. The third phase sequencer 116 can be configured to control respective "on" states and "off" states of one or more of the switches 110 in the third phase switch group 108. In an example, one or more of the first phase sequencer 112, second phase sequencer 114, and third phase sequencer 116 can be combined, at least in part. For example, one or more of the first phase sequencer 112, the second phase sequencer 114, or the third phase sequencer 116 can be placed on the same chip, executed by the same circuitry, or both. In an example, one or more of the first phase sequencer 112, the second phase sequencer 114, or the third phase sequencer 116 can be placed on a different chip.

The first phase sequencer 112 can include a processor, a memory, and a communication interface. The second phase sequencer 114 and the third phase sequencer 116 can be configured similarly to the first phase sequencer 112, or can differ in one or more ways.

The controller 118 can be any system capable of executing instructions. The controller 118 can be configured to communicate with the sequencer 140 (e.g., communicate with the first phase sequencer 112). The controller can generate one or more signals to configure how the sequencer 140 operates. In an example, the signals can be sent to the sequencer 140 over an internal bus (e.g., the controller 118 and the sequencer 140 can be included on the same chip, board, or both). The controller 118 can receive a feedback signal (e.g., on the digital feedback signal bus 136) indicative of the switched output signal at the switched output signal node 126. For example, the feedback signal can indicate a voltage level and/or frequency of the switched output signal at the switched output signal node 126. The controller 118 can signal the sequencer 140 to adjust the switched output signal at the switched output signal node 126, such as based on the received feedback signal. For example, a duty cycle of the switched output signal at the switched output signal node 126 may need to be adjusted, such as to generate a specified output voltage, such as due to a size (e.g., impedance) of the load 130. In an example, one or more features of the controller 118 can be performed by the sequencer 140, or vice versa. In an example, the controller 118 and the sequencer 140 can be combined, at least in part.

The switch control system 100 can include feedback circuitry 134. The feedback circuitry 134 can receive any signal indicative of the switched output signal node 126, and can send a feedback signal to the controller 118 based on the received signal. The feedback circuitry 134 can receive an analog feedback signal (e.g., on the analog feedback signal lines 132), and generate a digital feedback signal (e.g., on the digital feedback signal bus 136). The feedback circuitry 134 can include an analog to digital converter (ADC). The feedback circuitry 134 can also include processing or computation circuitry, which can operate on an output of the ADC. In an example, the feedback circuitry 134 may be omitted, at least in part, and the feedback signal may be sent to the controller 118 directly.

In the example of FIG. 1B, the signal received by the feedback circuitry 134 can include an indication of the voltage or current on the switched output signal node 126. In an example, the feedback signal could be an encoder, such as a rotational encoder, such as could provide an indication of the position or angular speed of the shaft of a motor. The feedback circuitry 134 can include one or more of resolvers, Hall sensors, encoders, sigma delta ADCs optionally with SINC filters, successive approximation register (SAR) type ADCs, etc.

FIG. 2 shows an example of portions of a switched output signal including a switch group 102. For example, FIG. 2 can show an example of the first phase switched output signal 206, such as may be at the first phase switched output signal node 128 (e.g., the switched output signal of the first phase switch group 104). FIG. 2 shows that the first phase switched output signal 206 at the first phase switched output signal node 128 can be configured to simulate a specified target signal 202, such as can be an analog signal (e.g., not a discrete voltage level signal, such as an AC signal). FIG. 2 shows that the first phase switched output signal 206 at the first phase switched output signal node 128 can include 5 discrete voltage levels 208-216, as discussed above.

FIG. 3 shows an example of portions of the first phase switched output signal 206 at the first phase switched output signal node 128 of FIG. 2, such as in the region 204 of FIG. 2. FIG. 3 shows the switching states used to generate the first phase switched output signal 206 at first phase switched output signal node 128. FIG. 4 shows an example of portions of a state table, such as for the first phase switch group 104. FIG. 4 shows that each of the states can include a state for one or more of the switches 110 (e.g., each of the eight switches 110 $S_1$ through $S_8$) in the first phase switch group 104.

A switch state can include a vector representation of the state of one or more of the switches 110 (e.g., all) in a switch group (e.g., the first phase switch group 104). For example, the switch state can include a linear array of digital values (e.g., ones and zeroes) representing the state of respective switches (e.g., a one representing an on state, a zero representing an off state). One or more of the switch states (e.g., each) can include a respective state for one or more (e.g., each) of the switches 110 in the first phase switch group 104. FIG. 3 shows that the switch states can include one or more power states (e.g., represented with a V) and one or more transition states (e.g., represented with a T). The power states can be configured for generating a portion of the first phase switched output signal 206 at first phase switched output signal node 128. In an example, there can be any number of power states, which can include two, three, four, five or six or more power states. In an example, more than one switch state can generate the same discrete voltage level (e.g., $V_2$ and $V_3$ can both output ¼ VDC).

The transition states can be configured for inhibiting, preventing, reducing, or otherwise tailoring one or more of (1) shoot-through (e.g., a short circuit condition, a condition in which current flows along an undesired path), (2) a reverse current condition (e.g., when current flows in an undesired direction through a portion of the first phase switch group 104 (e.g., flowing the wrong direction through a switch 110)), (3) damage to the first phase switch group 104 (e.g., due to overcurrent, due to reverse current, etc.), such as when switching between power states, or (4) reducing glitch energy when transitioning between states. In an example, there can be any number of transition states, which can include one, two, three, four, or five or more transition states.

For example, when switching from one power state to another power state (e.g., $V_1$ to $V_2$), one or more of the timing of the various switches (e.g., the synchronization, order, or delay) may be uncertain or difficult to determine, the speed of the switching (e.g., how fast a switch turns from off to on, on to off, or both) may be non-zero, or another circuit property (e.g., inductance) may make the switching unpredictable. Due to one or more of these effects, there may be an overlap in switch states (e.g., two switches are at least partially on concurrently) that causes one or more undesirable circuit conditions, which can include one or more of shoot-through, a reverse current condition, or damage to the first phase switch group 104. A transition state can be used as an intermediate switch state when switching between power states. For example, a transition state can help to prevent or reduce one or more undesirable circuit conditions (e.g., shoot-through, a reverse current condition, or damage to the first phase switch group 104). For example, transitioning to and/or from a specified transition state can one or more of be a safe transition with a lesser or no risk of undesirable circuit conditions, be a transition with a less critical timing (e.g., a timing that can be achieved more readily using the switch control system 100), or a transition that may exhibit an undesirable circuit condition, but to a lesser degree, at least on average, than a transition between power states with no intermediate transition state. Transition states can be used to help reduce the occurrence of so called "illegal" states, in which two or more switches 110 are in an undesired or incompatible state simultaneously or at least partially concurrently.

One or more transition states can be shared between one or more transitions. For example, one transition state can be used when transitioning between all power states. In an example, transitions between specific power states can use specific transition states. In an example, a transition state may not be used and/or desired when switching between some power states (e.g., due to a lower risk of an undesirable circuit condition). In an example, a transition pattern (e.g., sequence of states) can be used, alternatively or in addition to a transition state.

The first phase sequencer 112 can be configured to control one or more of the switches 110 through a specified sequence of switch states. For example, the first phase sequencer 112 can generate a signal to turn respective ones of the switches 110 on and/or off. For example, the first phase sequencer 112 can be coupled to the switches 110 of the first phase switch group 104 using the pulse width modulation (PWM) signal lines 138. The PWM signal lines 138 can include a connection to a control node (e.g., gate node) of one or more of the switches 110 in the first phase switch group 104.

In an example, the first phase sequencer 112 can be configured to control the switches 110 through a specified sequence of switch states so that the first phase switch group 104 is in a power state for longer than the first phase switch group 104 is in a transition state. For example, a portion or all of the time when the first phase switch group 104 is in a transition state may not contribute to or benefit the first phase switched output signal 206 on the first phase switched output signal node 128. For example, a transition state may not be configured to supply power to the load 130. In an example, the first phase sequencer 112 can be configured such that the first phase switch group 104 is in a power state for twice as long, three times as long, four times as long, or five or more times as long as the first phase switch group 104 is in a transition state, such as during a specified sequence of switch states.

In an example, the first phase switch group 104 can include at least six switches 110, the first phase switched output signal 206 on the first phase switched output signal node 128 can include at least five discrete voltage levels, or both. In an example, the signals on the PWM signal lines 138 can be generated at least in part using software (e.g., software within the sequencer 140).

In an example, the controller 118 can be configured to send configuration information to the first phase sequencer 112. The first phase sequencer 112 can be configured to control the respective on states and off states of the switches 110 using signals (e.g., PWM signals) based on the received configuration information. The configuration information can include a pattern identifier. The pattern identifier can cause the sequencer to go through a specified sequence of switch states. For example, a pattern can include a sequence of switch states (e.g., $V_1$ to $V_2$). The first phase sequencer 112 can be configured to repeat the pattern (e.g., recurrently go through the pattern and return to the beginning when the pattern is complete), such as until a new pattern identifier is received.

In an example, the configuration information can include a duty cycle identifier. The duty cycle identifier can include an indication of an amount of time that the first phase sequencer 112 should spend in one or more states.

Figure 5A:
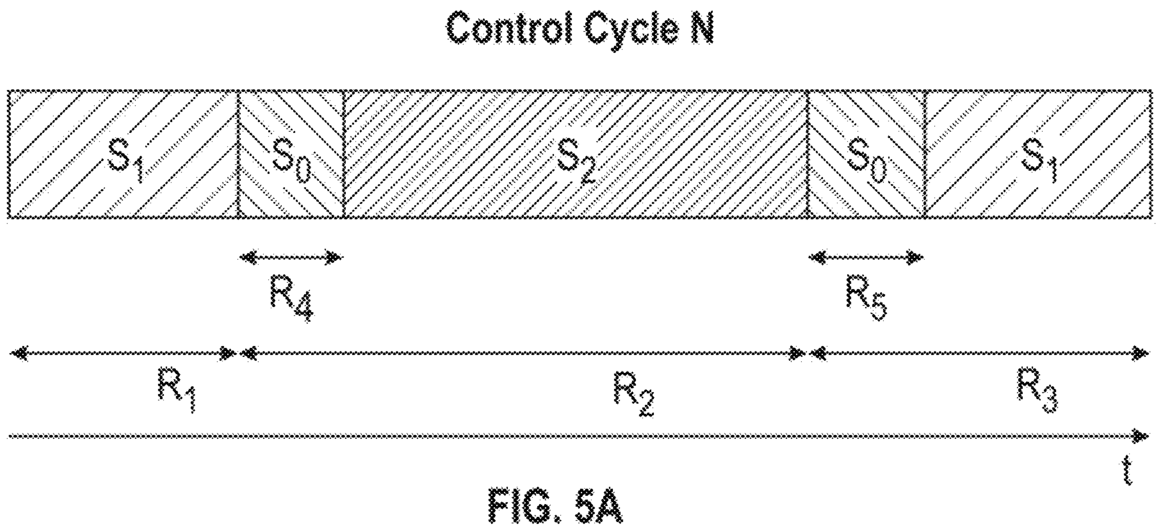
FIG. 5A shows a graph in time of an example of operating portions of the switch control system.
Figure 5B:
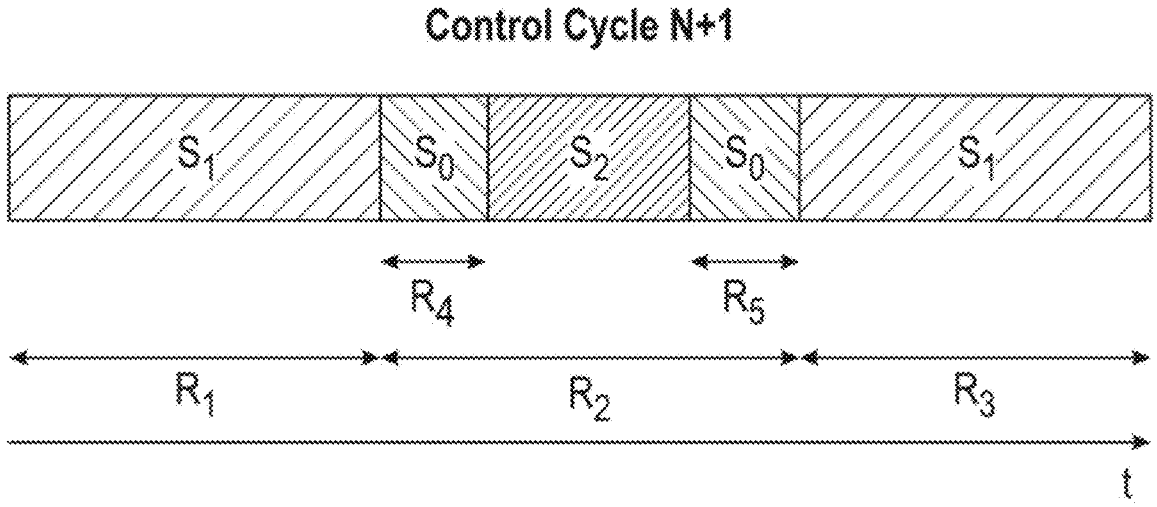
FIG. 5B shows a graph in time of an example of operating portions of the switch control system.

FIG. 5A and FIG. 5B show two conceptualized graphs in time of an example of operating portions of the switch control system 100. FIG. 5A and FIG. 5B both show the same pattern (e.g., $V_1$ to $V_2$ and back to $V_1$), but the ratio of the length of time spent in each switch state can differ (e.g., the ratio of $R_1$ to $R_2$, the ratio of $(R_1+R_3)$ to $R_2$). This ratio can be indicated by the duty cycle identifier. For example, a duty cycle identifier of 50% can indicate a ratio of 1:1, a duty cycle identifier of 75% can indicate a ratio of 3:1, etc.

The configuration information can also include a frequency identifier. The frequency identifier can include an indication of how often the pattern is to be repeated (e.g., how many times per second to repeat the pattern), how long (e.g., how long on average) each switch state is to last, or both. In an example, the specific length of and/or sequence of switch states can be determined at the first phase sequencer 112. This can help to reduce and/or alter a workload of the controller 118, such as by transferring a portion of the workload to the first phase sequencer 112. In an example, the first phase sequencer 112 can include hardware and/or software that is configured (e.g., optimized) for performing the operations needed to determine the order and/or length of switch states using one or more of the pattern identifier, the duty cycle identifier, or the frequency identifier. In an example, the duration of a pattern can stay the same for one or more cycles but the duration of one or more states within the pattern can be adjusted.

The controller 118 can be configured to receive feedback information indicative of the first phase switched output signal 206 on the first phase switched output signal node 128, such as can include an amplitude (e.g., a current or voltage level), a frequency, or another parameter. The controller 118 can be configured to adjust the configuration information sent to the first phase sequencer 112, such as based on the received feedback information. For example, the duty cycle identifier can be adjusted in response to the amplitude indicated by the feedback signal.

As discussed above, the switch control system 100 can be configured to control the first phase switch group 104 to produce a pulse-width-modulation (PWM) form of an alternating current (AC) signal. In this way, the switch control system 100 can be used to drive a motor (e.g., such as in a variable frequency drive (VFD)), be used in an inverter (e.g., generating an AC output from a DC input, generating DC output from a DC input, etc.), or both. In an example, the switch control system 100 can be used to control any switch system (e.g., the switch group 102). For example, the switch control system 100 can be used with any inverter topology or other switching topology.

In an example, the sequencer 140 (e.g., through the second phase sequencer 114) can be configured to control respective on and off states of at least two switches in a second switch group (e.g., the second phase switch group 106) to generate a second phase switched output signal. Alternatively, or in addition, the sequencer 140 can be configured (e.g., through the third phase sequencer 116) to control respective on and off states of at least two switches in a third switch group (e.g., the third phase switch group 108) to generate a third phase switched output signal.

In an example, the first phase switched output signal 206 at first phase switched output signal node 128, the second phase switched output signal, and the third phase switched output signal can have differing phases (e.g., the signals can reach their AC peaks at different times, such as while sharing a frequency). In an example, the first phase switched output signal 206 at first phase switched output signal node 128, the second phase switched output signal, and the third phase switched output signal can be substantially the same in magnitude and/or frequency and spaced apart in time by approximately 120 degrees of phase shift. In this way, the switched output signal at switched output signal node 126 can form a three-phase AC signal, such as which can be used to power three-phase utilization equipment.

Figure 6:
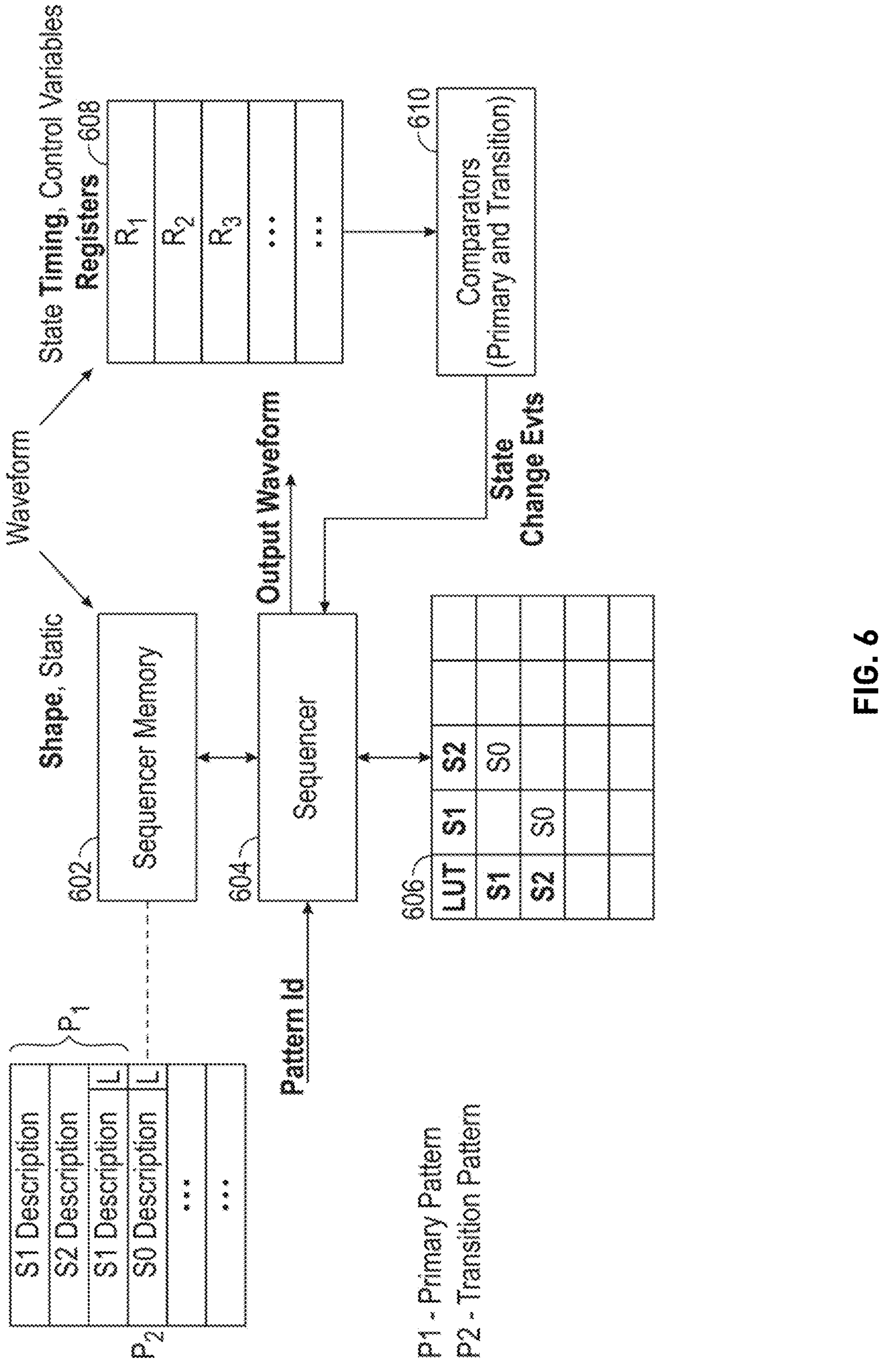
FIG. 6 shows a block diagram of an example of portions of a sequencer.

FIG. 6 shows a block diagram of an example of portions of a sequencer 140. FIG. 6 shows that the sequencer 140 can include memory 602, processor 604, look-up-table 606, registers 608, and comparators 610. The memory 602 can store one or more pieces of data, such as the configuration information received from the controller 118.

The registers 608 can store information which is used by the processor 604, such as timing information. The information in the registers 608 can be at least partially received or generated by information in the configuration information. The comparators 610 can determine when to change states and/or patterns based upon the result of comparisons. For example, the comparators 610 can receive feedback information (e.g., from the controller 118) and can compare the received information to a specified goal value (e.g., a specified output) to determine when to change states. The look-up-table 606 can provide information to the processor 604 on which transition state to use between power states.

The processor 604 can perform one or more operations, such as generating the signals on the PWM signal lines 138 based upon the data in the memory 602, the timing values in the registers 608, or the output of the comparators 610.

Figure 7:
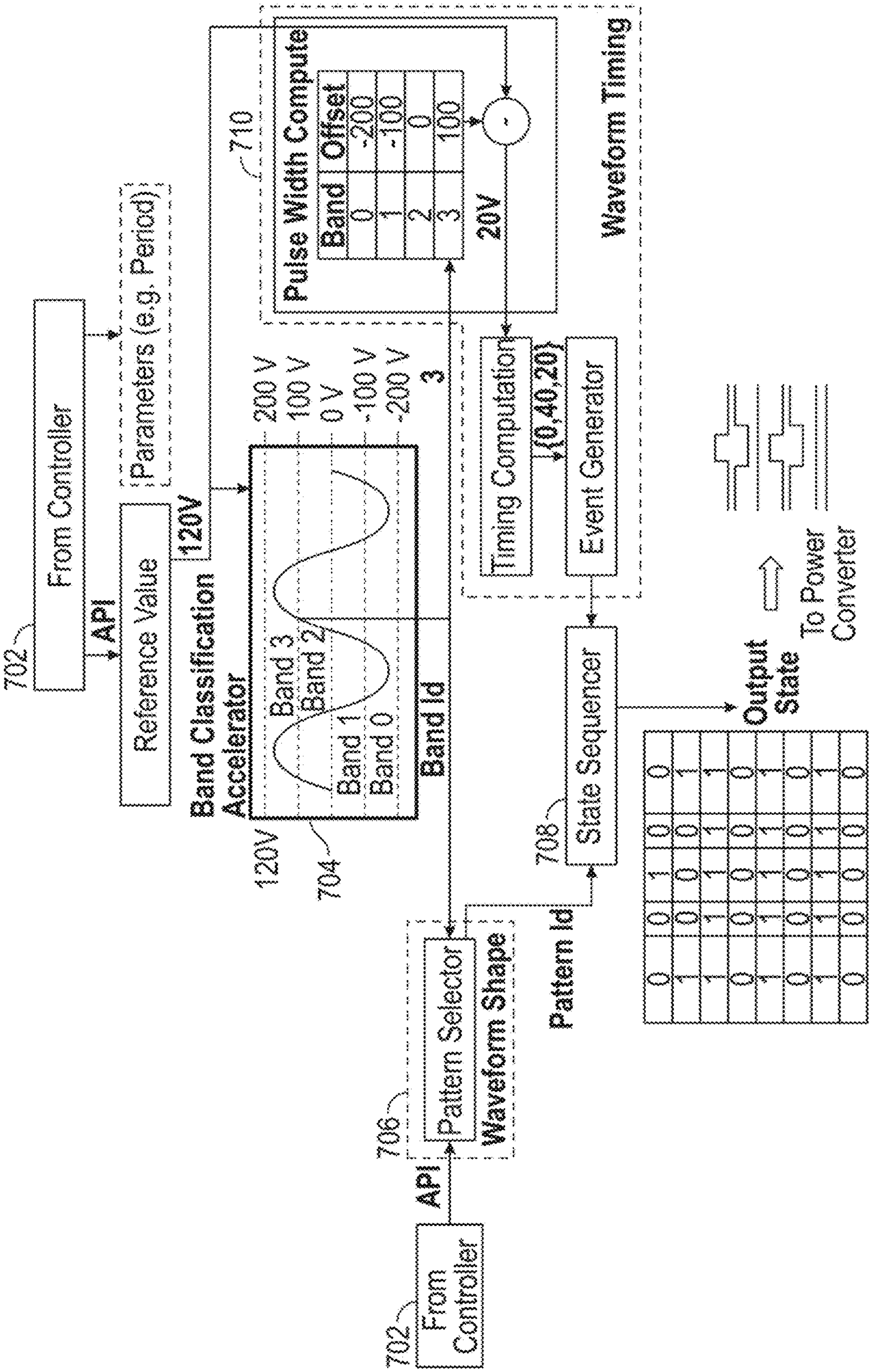
FIG. 7 shows a block diagram of an example of portions of a sequencer.

FIG. 7 shows a block diagram of an example of portions of a sequencer 140. FIG. 7 shows that the sequencer 140 can include a band classifier 704, a pattern selector 706, a state sequencer 708, and a timing generator 710.

FIG. 7 shows that the sequencer 140 can receive configuration information 702, such as from the controller 118. The configuration information 702 can include pattern information, reference value information, and other parameters (e.g., period, frequency, etc.). In an example, the configuration information 702 can also include feedback information, such as can be indicative of the value of the switched output signal on the switched output signal node 126. The configuration information 702 can be used to generate the output signal on the PWM signal lines 138.

The band classifier 704 can receive a reference value (e.g., a desired output voltage, such as an root-mean-square (RMS) value). Based upon this reference value and the signal phase, the band classifier 704 can determine which band the switch group 102 is operating in. The band classifier 704 can send the band value to the pattern selector 706.

The pattern selector 706 can select the specified pattern for the band. For example, the configuration information 702 can include a pattern form multiple (e.g., all) bands. The pattern selector 706 can pass the pattern to the state sequencer 708.

The timing generator 710 can control the timing of the selected pattern, such as based on a received or calibrated timing or a responsive timing, such as can be based on the feedback signal. The timing generator 710 can generate timing information (e.g., a signal to switch states) based on the information received by the timing generator 710. In an example, the timing generator 710 can include the comparators 610.

The state sequencer 708 can provide a specified output state to generate the switched output signal. The state sequencer 708 can use the pattern received from the pattern selector 706 and the timing information received from the timing generator 710 to sequence the output states.

Figure 8:
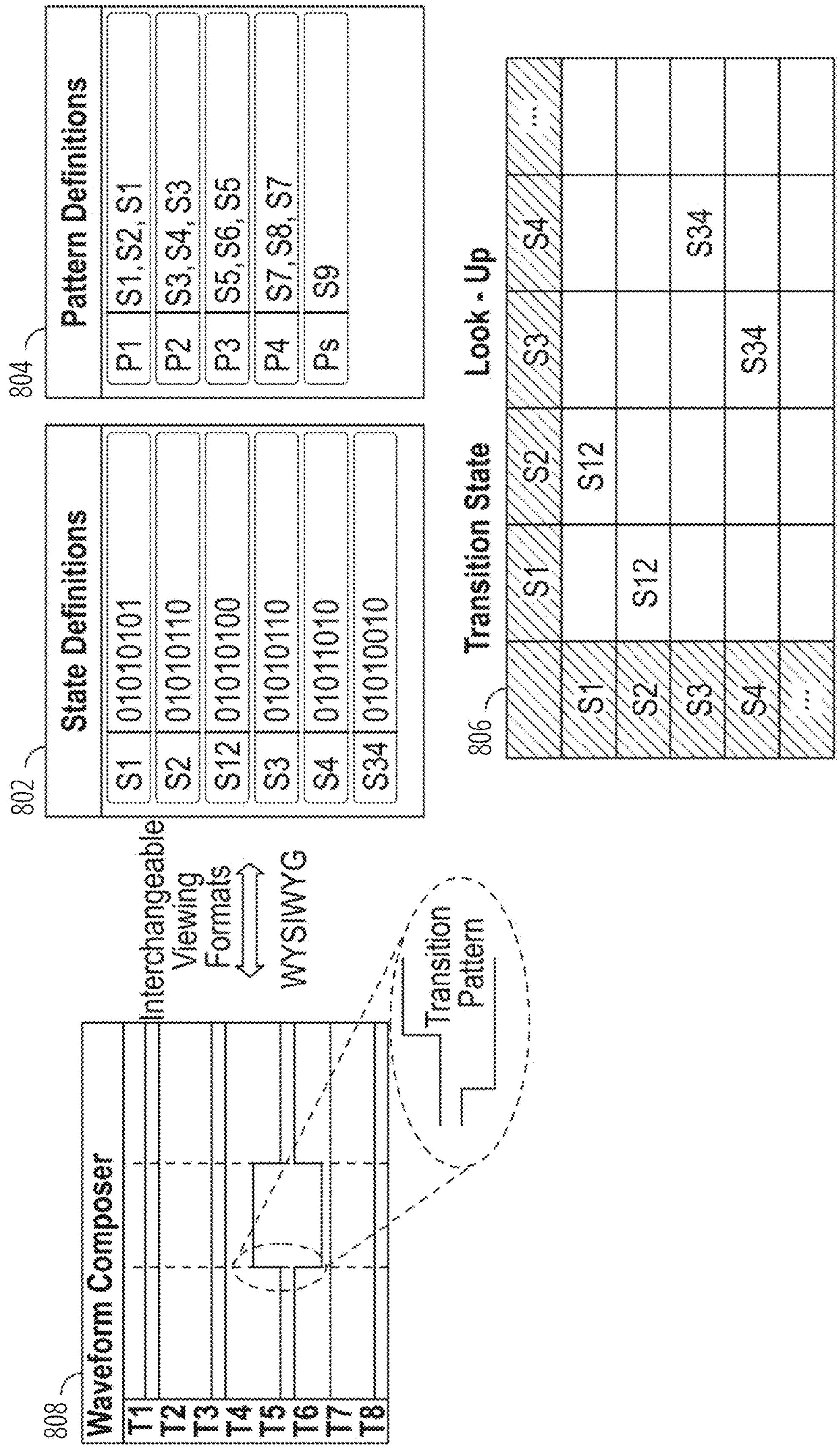
FIG. 8 shows an example of portions of a state table, a pattern table, and a transition look up table.

FIG. 8 shows an example of portions of a state table 802, a pattern table 804, a transition state look up table 806, and a waveform composer 808. In an example, one or more of the state table 802, the pattern table 804, or the transition state look up table 806 can be stored in memory in the sequencer 140. In an example, one of more of these tables can be stored, alternatively or additionally, at the controller 118. In the example of FIG. 8, the pattern definitions need not include the transition states. Instead, the sequencer 140 can insert the transition states between power states using the transition state look up table 806 (e.g., when switching between power states, the transition state look up table 806 is referenced to determine if a transition state is needed and/or what transition state to use). This can make it easier to program the patterns, reduce an amount of data that must be passed between the controller 118 and the sequencer 140, or both.

In an example, one or more of the state table 802, a pattern table 804, a transition state look up table 806, or the waveform composer 808 can be viewable by a user in a programming interface, such as a graphical user interface. The waveform composer 808 can be used to generate one or more of the state table 802, the pattern table 804, or the transition state look up table 806, or vice versa. For example, a user can program the waveform composer 808, and then transform the programmed waveforms into state table 802 and the pattern table 804. In an example, the user can program the state table 802 and the pattern table 804, and then view the switch states in the waveform composer 808.

In an example, portions of a switch control system configuration can be built using a graphical user interface. The state table 802 and/or the pattern table 804 can be programmed, such as using a graphical user interface. Then, the configuration can be built (e.g., compiled) into the switch control system configuration, such as can be stored within the sequencer 140. For example, the switch control system configuration information 702 can be stored in a series of registers within the sequencer 140. The controller 118 can send an instruction to the sequencer 140 to run a specific pattern (e.g., a pattern identifier). In response to this instruction, the sequencer 140 can be configured to reference the registers corresponding to this pattern, and sequence through the states included in the pattern. Additionally, the controller 118 can send configuration arguments (e.g., a duty cycle identifier, a frequency identifier), which can be used to alter how the sequencer 140 sequences through the pattern.

The sequencer 140 can use an internal processor to reference one or more of the state table 802, the pattern table 804, and the transition state look up table 806, and can control the switch group 102 based upon the referenced tables. For example, a number of operations may be performed in the software domain before the signals are generated in the hardware domain. The signals on the PWM signal lines 138 can be generated using PWM output components, such as can be controlled by the processor within the sequencer 140. This PWM output components can be configured for driving PWM signals, such as including a specified frequency and duty cycle.

Figure 9:
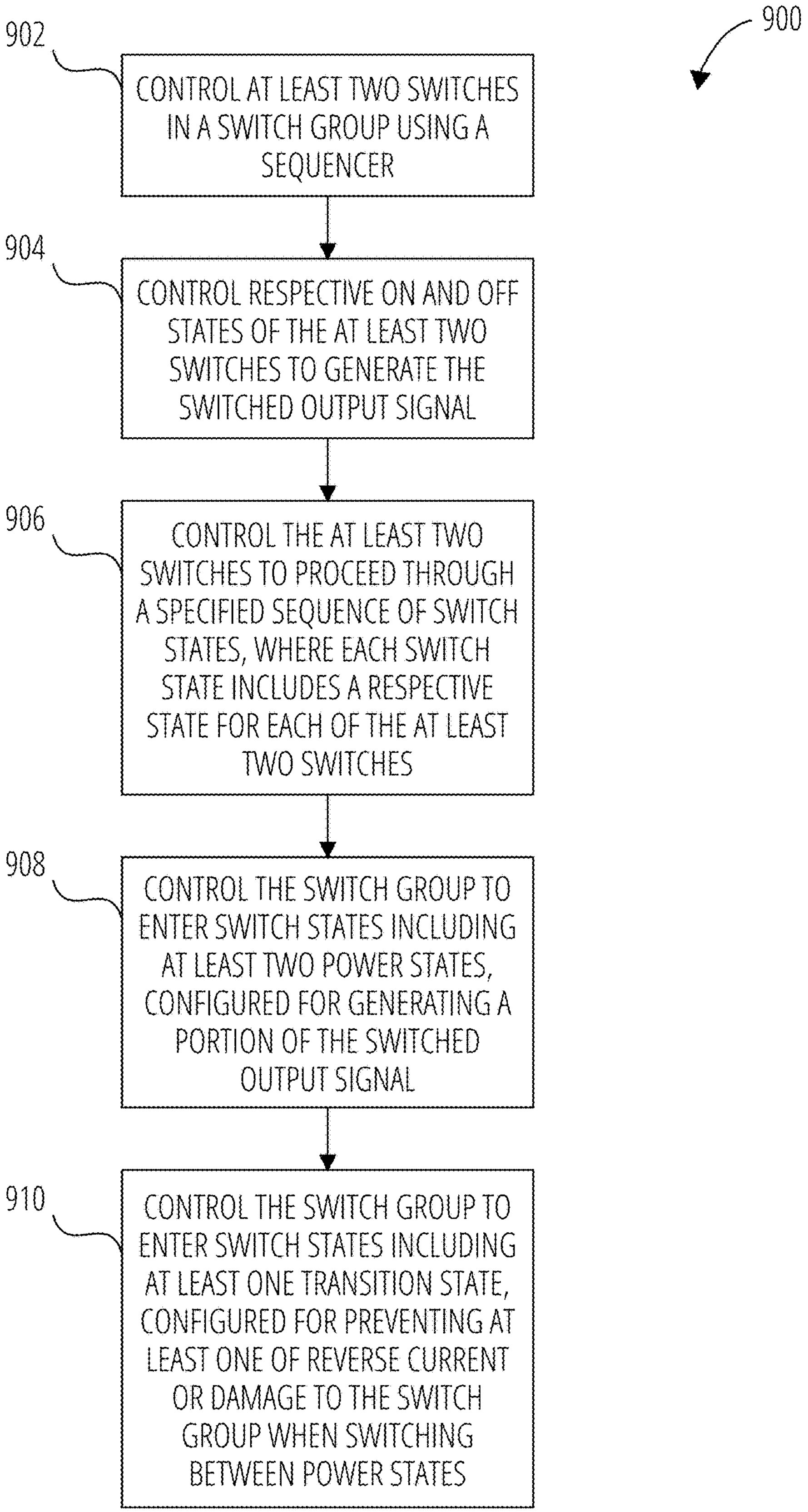
FIG. 9 shows an example of portions of a method for operating a switch control system.

FIG. 9 shows an example of portions of a method 900 for operating a switch control system, such as the switch control system 100. The method 900 can include a method for generating a switched output signal including more than two discrete voltage levels. At step 902, one or more switches in a switch group can be controlled using a sequencer. This can include controlling one or more of the switches 110 using the sequencer 140.

At step 904, respective on and off states of the one or more switches can be controlled to generate the switched output signal. For example, the switched output signal on the switched output signal node 126 can be generated.

At step 906, the one or more switches can be controlled to proceed through a specified sequence of switch states. One or more of the switch states can include a respective state for each of the at least two switches. This can include sequencing through the switch states of a specified pattern.

At step 908, the switch group can be controlled to enter switch states including one or more power states, such as can be configured for generating a portion of the switched output feedback signal.

At step 910, the switch group can be controlled to enter switch states including one or more transition states, such as can be configured for preventing one or more of reverse current or damage to the switch group, such as when switching between power states.

In an example, a pattern can be defined using sequences of switch states. The switch group can be controlled to sequence through the switch states in the defined pattern. The pattern can include an order of respective switch states in the respective pattern. In an example, controlling the switch group to sequence through the switch states in the defined pattern can include determining a length of time spent in respective switch states at least in part using a duty cycle identifier (e.g., as discussed above).

In an example, the switch states and/or patterns can be built and/or specified using a graphical user interface. For example, a computer program can be used to configure the state table 802 and the pattern table 804. This can reduce a level of skill that is needed to program the switch control system 100, reduce a probability of an error being introduced when programing the switch control system 100, or both.

In an example, an operation mode can be built, such as using a sequence of patterns in the graphical user interface.

The operation mode can include a specified sequence of patterns and an indication of when to switch between patterns. A compiling program can be used to configure the sequencer to control the switch group to perform the sequence of patterns in the operation mode. In an example, the sequence of patterns in the operation mode can be configured to generate a switched output signal that represents a pulse-width-modulation (PWM) form of an alternating current (AC) signal.

In an example, building the pattern can include selecting a specified order of power states, such as without requiring selecting transition states. In this example, using the compiling program can include selecting transition states to insert between respective power states, such as using a look up table (e.g., the transition state look up table 806). This can help to simplify the configuration process by offloading the selection of transition states to the compiling program, the sequencer 140, or both.

The shown order of steps is not intended to be a limitation on the order in which the steps are performed. In an example, two or more steps may be performed simultaneously or at least partially concurrently.

Figure 10:
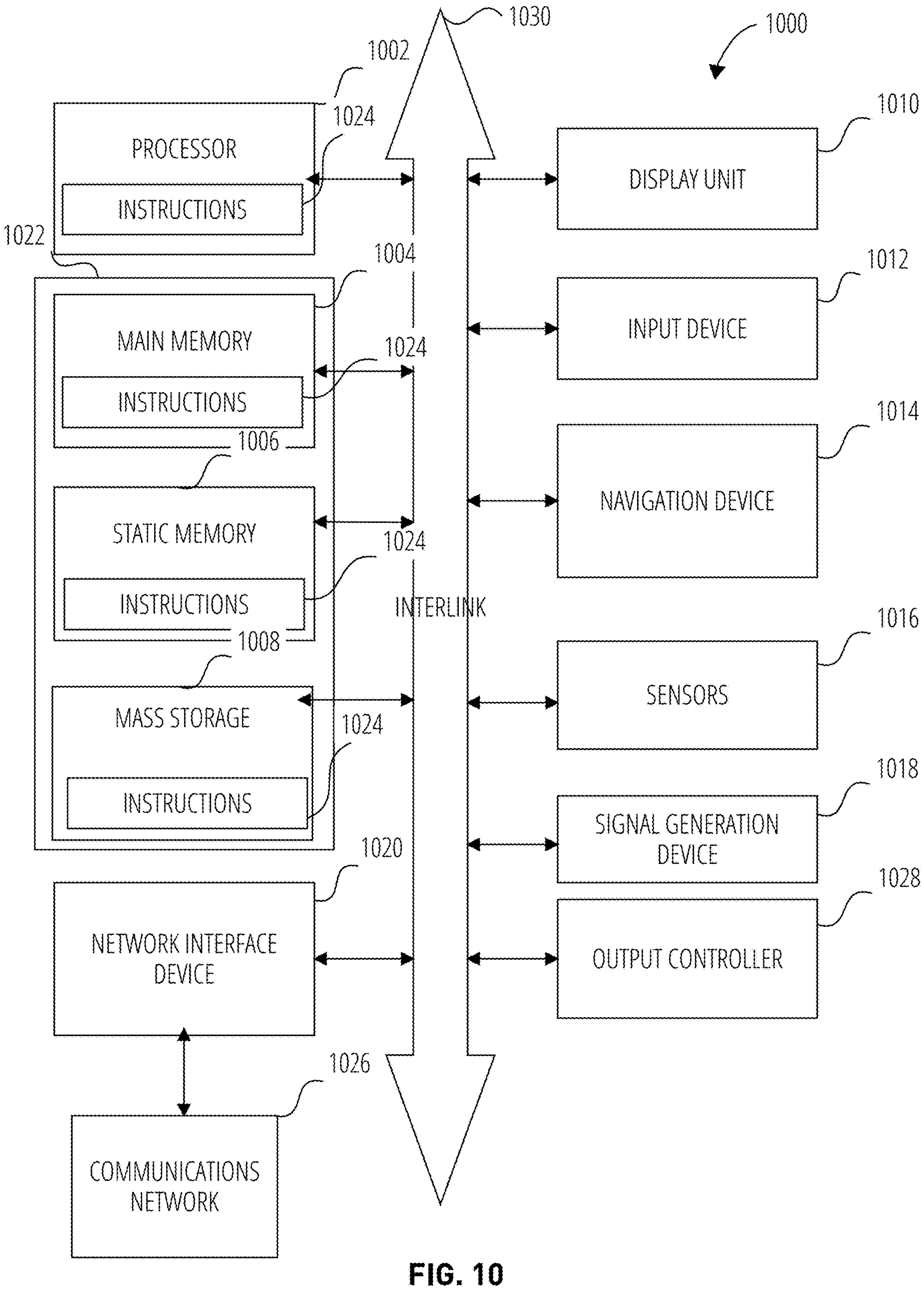
FIG. 10 is a block diagram of an example of portions of a machine upon which one or more portions of the present disclosure may be implemented.

FIG. 10 illustrates a block diagram of an example machine 1000 upon which any one or more of the techniques (e.g., methodologies) discussed herein may be implemented. Examples, as described herein, may include, or may operate by, logic or a number of components, or mechanisms in the machine 1000. Circuitry (e.g., processing circuitry) is a collection of circuits implemented in tangible entities of the machine 1000 that include hardware (e.g., simple circuits, gates, logic, etc.). Circuitry membership may be flexible over time. Circuitries include members that may, alone or in combination, perform specified operations when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a machine readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable embedded hardware (e.g., the execution units or a loading mechanism) to create members of the circuitry in hardware via the variable connections to carry out portions of the specific operation when in operation. Accordingly, in an example, the machine readable medium elements are part of the circuitry or are communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time. Additional examples of these components with respect to the machine 1000 follow.

In alternative examples, the machine 1000 may operate as a standalone device or may be connected (e.g., networked) to other machines. In a networked deployment, the machine 1000 may operate in the capacity of a server machine, a client machine, or both in server-client network environments. In an example, the machine 1000 may act as a peer machine in peer-to-peer (P2P) (or other distributed) network environment. The machine 1000 may be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

The machine 1000 may include a hardware processor 1002 (e.g., a central processing unit (CPU), a graphics processing unit (GPU), a hardware processor core, or any combination thereof), a main memory 1004, a static memory (e.g., memory or storage for firmware, microcode, a basic-input-output (BIOS), and mass storage 1008 (e.g., hard drives, tape drives, flash storage, or other block devices) some or all of which may communicate with each other via an interlink 1030 (e.g., bus). The machine 1000 may further include a display unit 1010, an alphanumeric input device 1012 (e.g., a keyboard), and a user interface (UI) navigation device 1014 (e.g., a mouse). In an example, the display unit 1010, input device 1012 and UI navigation device 1014 may be a touch screen display. The machine 1000 may additionally include a signal generation device 1018 (e.g., a speaker), a network interface device 1020, and one or more sensors 1016, such as a global positioning system (GPS) sensor, compass, accelerometer, or other sensor. The machine 1000 may include an output controller 1028, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

Registers of the processor 1002, the main memory 1004, the static memory 1006, or the mass storage 1008 may be, or include, a machine readable medium 1022 on which is stored one or more sets of data structures or instructions 1024 (e.g., software) embodying or utilized by any one or more of the techniques or functions described herein. The instructions 1024 may also reside, completely or at least partially, within any of registers of the processor 1002, the main memory 1004, the static memory 1006, or the mass storage 1008 during execution thereof by the machine 1000. In an example, one or any combination of the hardware processor 1002, the main memory 1004, the static memory 1006, or the mass storage 1008 may constitute the machine readable media 1022. While the machine readable medium 1022 is illustrated as a single medium, the term "machine readable medium" may include a single medium or multiple media (e.g., a centralized or distributed database, and/or associated caches and servers) configured to store the one or more instructions 1024.

The term "machine readable medium" may include any medium that is capable of storing, encoding, or carrying instructions for execution by the machine 1000 and that cause the machine 1000 to perform any one or more of the techniques of the present disclosure, or that is capable of storing, encoding or carrying data structures used by or associated with such instructions. Non-limiting machine readable medium examples may include solid-state memories, optical media, magnetic media, and signals (e.g., radio frequency signals, other photon based signals, sound signals, etc.). In an example, a non-transitory machine readable medium comprises a machine readable medium with a plurality of particles having invariant (e.g., rest) mass, and thus are compositions of matter. Accordingly, non-transitory machine-readable media are machine readable media that do not include transitory propagating signals. Specific examples of non-transitory machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

In an example, information stored or otherwise provided on the machine readable medium 1022 may be representative of the instructions 1024, such as instructions 1024 themselves or a format from which the instructions 1024 may be derived. This format from which the instructions 1024 may be derived may include source code, encoded instructions (e.g., in compressed or encrypted form), packaged instructions (e.g., split into multiple packages), or the like. The information representative of the instructions 1024 in the machine readable medium 1022 may be processed by processing circuitry into the instructions to implement any of the operations discussed herein. For example, deriving the instructions 1024 from the information (e.g., processing by the processing circuitry) may include: compiling (e.g., from source code, object code, etc.), interpreting, loading, organizing (e.g., dynamically or statically linking), encoding, decoding, encrypting, unencrypting, packaging, unpackaging, or otherwise manipulating the information into the instructions 1024.

In an example, the derivation of the instructions 1024 may include assembly, compilation, or interpretation of the information (e.g., by the processing circuitry) to create the instructions 1024 from some intermediate or preprocessed format provided by the machine readable medium 1022. The information, when provided in multiple parts, may be combined, unpacked, and modified to create the instructions 1024. For example, the information may be in multiple compressed source code packages (or object code, or binary executable code, etc.) on one or several remote servers. The source code packages may be encrypted when in transit over a network and decrypted, uncompressed, assembled (e.g., linked) if necessary, and compiled or interpreted (e.g., into a library, stand-alone executable etc.) at a local machine, and executed by the local machine.

The instructions 1024 may be further transmitted or received over a communications network 1026 using a transmission medium via the network interface device 1020 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), LoRa/LoRaWAN, or satellite communication networks, mobile telephone networks (e.g., cellular networks such as those complying with 3G, 4G LTE/LTE-A, or 5G standards), Plain Old Telephone (POTS) networks, and wireless data networks (e.g., Institute of Electrical and Electronics Engineers (IEEE) 802.11 family of standards known as Wi-Fi®, IEEE 802.15.4 family of standards, peer-to-peer (P2P) networks, among others. In an example, the network interface device 1020 may include one or more physical jacks (e.g., Ethernet, coaxial, or phone jacks) or one or more antennas to connect to the communications network 1026. In an example, the network interface device 1020 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 1000, and includes digital or analog communications signals or other intangible medium to facilitate communication of such software. A transmission medium is a machine-readable medium.

The following, non-limiting examples, detail certain aspects of the present subject matter to solve the challenges and provide the benefits discussed herein, among others.

EXAMPLES

Example 1 is a switch control system for controlling a switch group, including at least two switches, to generate a switched output signal, including more than two discrete voltage levels, the switch control system comprising: a sequencer, configured to control respective on states and off states of the at least two switches to generate the switched output signal, including to: control the at least two switches through a specified sequence of switch states, wherein each switch state includes a respective state for each of the at least two switches; and wherein the switch states include: at least two power states, configured for generating a portion of the switched output signal; and at least one transition state, configured for preventing at least one of shoot-through, a reverse current condition, or damage to the switch group when switching between power states.

In Example 2, the subject matter of Example 1 optionally includes wherein the sequencer is configured to control the at least two switches through the specified sequence of switch states so that the switch group is in a power state for at least five times as long as the switch group is in a transition state.

In Example 3, the subject matter of any one or more of Examples 1-2 optionally include wherein: the switch group includes at least six switches; and the switched output signal includes at least five discrete voltage levels.

In Example 4, the subject matter of any one or more of Examples 1-3 optionally include a controller, configured to: send configuration information to the sequencer; and wherein the sequencer is configured to control the respective on states and off states of the at least two switches using PWM signals based on the received configuration information.

In Example 5, the subject matter of Example 4 optionally includes wherein the configuration information includes a pattern identifier, wherein the pattern identifier causes the sequencer to go through a specified sequence of switch states.

In Example 6, the subject matter of Example 5 optionally includes wherein the configuration information includes a duty cycle identifier, wherein the duty cycle identifier indicates an amount of time that the sequencer spends in one or more states.

In Example 7, the subject matter of Example 6 optionally includes wherein the controller is configured to: receive feedback information indicative of the switched output signal; and adjust the configuration information sent to the sequencer based on the received feedback information.

In Example 8, the subject matter of any one or more of Examples 1-7 optionally include wherein the sequencer is configured to control the switch group to produce a pulse-width-modulation (PWM) form of an alternating current (AC) signal.

In Example 9, the subject matter of Example 8 optionally includes wherein: the sequencer is configured to control respective on and off states of at least two switches in a second switch group to generate a second switched output signal; and the sequencer is configured to control respective on and off states of at least two switches in a third switch group to generate a third switched output signal.

In Example 10, the subject matter of Example 9 optionally includes wherein: the switched output signal, the second switched output signal, and the third switched output signal have differing phases.

In Example 11, the subject matter of Example 10 optionally includes wherein: the switched output signal, the second switched output signal, and the third switched output signal are substantially the same in magnitude and spaced apart in time by approximately 120 degrees of phase shift.

In Example 12, the subject matter of any one or more of Examples 1-11 optionally include the switch group.

Example 13 is a method for generating a switched output signal including more than two discrete voltage levels, the method comprising; controlling at least two switches in a switch group using a sequencer, including: controlling respective on and off states of the at least two switches to generate the switched output signal; controlling the at least two switches to proceed through a specified sequence of switch states, wherein each switch state includes a respective state for each of the at least two switches; and controlling the switch group to enter switch states including: at least two power states, configured for generating a portion of the switched output signal; and at least one transition state, configured for preventing at least one of shoot-through, reverse current, or damage to the switch group when switching between power states.

In Example 14, the subject matter of Example 13 optionally includes defining a pattern using sequences of switch states; and controlling the switch group to sequence through the switch states in the defined pattern.

In Example 15, the subject matter of Example 14 optionally includes wherein the pattern include an order of respective switch states in the respective pattern.

In Example 16, the subject matter of Example 15 optionally includes wherein controlling the switch group to sequence through the switch states in the defined pattern includes: determining a length of time spent in respective switch states at least in part using a duty cycle identifier.

In Example 17, the subject matter of any one or more of Examples 14-16 optionally include building the switch states and patterns using a graphical user interface; building an operation mode using a sequence of patterns in the graphical user interface; and using a compiling program, configuring the sequencer to control the switch group to perform the sequence of patterns in the operation mode.

In Example 18, the subject matter of Example 17 optionally includes wherein: building the pattern includes selecting a specified order of power states; and using the compiling program includes selecting a transition state to insert between respective power states using a look up table.

In Example 19, the subject matter of any one or more of Examples 17-18 optionally include wherein: the sequence of patterns in the operation mode is configured to generate a switched output signal that represents a pulse-width-modulation (PWM) form of an alternating current (AC) signal.

Example 20 is a switch control system for controlling a switch group, including at least six switches, to generate a switched output signal, including at least five discrete voltage levels, the switch control system comprising: a sequencer, configured to control respective on states and off states of the at least six switches to generate the switched output signal, including to: control the at least six switches through a specified sequence of switch states, wherein each switch state includes a respective state for each of the at least six switches; and a controller, configured to: send configuration information to the sequencer; wherein: the sequencer is configured to control the respective on states and off states of the at least six switches using PWM signals based on the received configuration information wherein the switch states include: at least two power states, configured for generating a portion of the switched output signal; and at least one transition state, configured for preventing at least one of shoot-through, a reverse current condition, or damage to the switch group when switching between power states.

Example 21 is at least one machine-readable medium including instructions that, when executed by processing circuitry, cause the processing circuitry to perform operations to implement of any of Examples 1-20.

Example 22 is an apparatus comprising means to implement of any of Examples 1-20.

Example 23 is a system to implement of any of Examples 1-20.

Example 24 is a method to implement of any of Examples 1-20.

Each of the non-limiting aspects above can stand on its own or can be combined in various permutations or combinations with one or more of the other aspects or other subject matter described in this document.

The above detailed description includes references to the accompanying drawings, which form a part of the detailed description. The drawings show, by way of illustration, specific examples that may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the terms "or" and "and/or" are used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The term "about," as used herein, means approximately, in the region of, roughly, or around. When the term "about" is used in conjunction with a numerical range, it modifies that range by extending the boundaries above and below the numerical values set forth. In general, the term "about" is used herein to modify a numerical value above and below the stated value by a variance of 10%. In one aspect, the term "about" means plus or minus 10% of the numerical value of the number with which it is being used. Therefore, about 50% means in the range of 45%-55%. Numerical ranges recited herein by endpoints include all numbers and fractions subsumed within that range (e.g., 1 to 5 includes 1, 1.5, 2, 2.75, 3, 3.90, 4, 4.24, and 5). Similarly, numerical ranges recited herein by endpoints include subranges subsumed within that range (e.g., 1 to 5 includes 1-1.5, 1.5-2, 2-2.75, 2.75-3, 3-3.90, 3.90-4, 4-4.24, 4.24-5, 2-5, 3-5, 1-4, and 2-4).

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Such instructions can be read and executed by one or more processors to enable performance of operations comprising a method, for example. The instructions are in any suitable form, such as but not limited to source code, compiled code, interpreted code, executable code, static code, dynamic code, and the like.

Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other examples may be used, such as by one of ordinary skill in the art upon reviewing the above description. The Abstract is to allow the reader to quickly ascertain the nature of the technical disclosure and is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the examples should be determined with reference to the appended claims, along with the full scope of equivalents to which such claims are entitled.

What is claimed is:

1. A switch control system for controlling a switch group, including at least two switches, to generate a switched output signal, including more than two discrete voltage levels, the switch control system comprising:

a sequencer, configured to control respective on states and off states of the at least two switches to generate the switched output signal, including to:

control the at least two switches through a specified sequence of switch states, wherein each switch state includes a respective state for each of the at least two switches; and wherein the switch states include:

at least two power states, configured for generating a portion of the switched output signal; and at least one transition state, configured for preventing at least one of shoot-through, a reverse current condition, or damage to the switch group when switching between power states.

2. The switch control system of claim 1, wherein the sequencer is configured to control the at least two switches through the specified sequence of switch states so that the switch group is in a power state for at least five times as long as the switch group is in a transition state.

3. The switch control system of claim 1, wherein:

the switch group includes at least six switches; and the switched output signal includes at least five discrete voltage levels.

4. The switch control system of claim 1, comprising:

a controller, configured to:

send configuration information to the sequencer; and wherein the sequencer is configured to control the respective on states and off states of the at least two switches using PWM signals based on the received configuration information.

5. The switch control system of claim 4, wherein the configuration information includes a pattern identifier, wherein the pattern identifier causes the sequencer to go through a specified sequence of switch states.

6. The switch control system of claim 5, wherein the configuration information includes a duty cycle identifier, wherein the duty cycle identifier indicates an amount of time that the sequencer spends in one or more states.

7. The switch control system of claim 6, wherein the controller is configured to:

receive feedback information indicative of the switched output signal; and adjust the configuration information sent to the sequencer based on the received feedback information.

8. The switch control system of claim 1, wherein the sequencer is configured to control the switch group to produce a pulse-width-modulation (PWM) form of an alternating current (AC) signal.

9. The switch control system of claim 8, wherein:

the sequencer is configured to control respective on and off states of at least two switches in a second switch group to generate a second switched output signal; and the sequencer is configured to control respective on and off states of at least two switches in a third switch group to generate a third switched output signal.

10. The switch control system of claim 9, wherein:

the switched output signal, the second switched output signal, and the third switched output signal have differing phases.

11. The switch control system of claim 10, wherein:

the switched output signal, the second switched output signal, and the third switched output signal are substantially the same in magnitude and spaced apart in time by approximately 120 degrees of phase shift.

12. The switch control system of claim 1, further comprising the switch group.

13. A method for generating a switched output signal including more than two discrete voltage levels, the method comprising;

controlling at least two switches in a switch group using a sequencer, including:

controlling respective on and off states of the at least two switches to generate the switched output signal;

controlling the at least two switches to proceed through a specified sequence of switch states, wherein each switch state includes a respective state for each of the at least two switches; and controlling the switch group to enter switch states including:

at least two power states, configured for generating a portion of the switched output signal; and at least one transition state, configured for preventing at least one of shoot-through, reverse current, or damage to the switch group when switching between power states.

14. The method of claim 13, comprising:

defining a pattern using sequences of switch states; and controlling the switch group to sequence through the switch states in the defined pattern.

15. The method of claim 14, wherein the pattern include an order of respective switch states in the respective pattern.

16. The method of claim 15, wherein controlling the switch group to sequence through the switch states in the defined pattern includes:

determining a length of time spent in respective switch states at least in part using a duty cycle identifier.

17. The method of claim 14, comprising:

building the switch states and patterns using a graphical user interface;

building an operation mode using a sequence of patterns in the graphical user interface; and using a compiling program, configuring the sequencer to control the switch group to perform the sequence of patterns in the operation mode.

18. The method of claim 17, wherein:

building the pattern includes selecting a specified order of power states; and using the compiling program includes selecting a transition state to insert between respective power states using a look up table.

19. The method of claim 17, wherein:

the sequence of patterns in the operation mode is configured to generate a switched output signal that represents a pulse-width-modulation (PWM) form of an alternating current (AC) signal.

20. A switch control system for controlling a switch group, including at least six switches, to generate a switched output signal, including at least five discrete voltage levels, the switch control system comprising:

a sequencer, configured to control respective on states and off states of the at least six switches to generate the switched output signal, including to:

control the at least six switches through a specified sequence of switch states, wherein each switch state includes a respective state for each of the at least six switches; and a controller, configured to:

send configuration information to the sequencer; wherein:

the sequencer is configured to control the respective on states and off states of the at least six switches using PWM signals based on the received configuration information wherein the switch states include:

at least two power states, configured for generating a portion of the switched output signal; and at least one transition state, configured for preventing at least one of shoot-through, a reverse current condition, or damage to the switch group when switching between power states.

* * * * *